US007042060B2

(12) United States Patent
Costello et al.

(10) Patent No.: US 7,042,060 B2
(45) Date of Patent: May 9, 2006

(54) BACKSIDE THINNING OF IMAGE ARRAY DEVICES

(75) Inventors: Kenneth A Costello, Alameda County, CA (US); Kevin P. Fairbairn, Santa Clara County, CA (US); David W. Brown, Alameda County, CA (US); Yun Chung, Santa Clara County, CA (US); Patricia Gober, Santa Clara County, CA (US); Edward Yin, Santa Clara County, CA (US)

(73) Assignee: Intevac, Inc., Santa Clara, CA (US)

( * ) Notice: Subject to any disclaimer, the term of this patent is extended or adjusted under 35 U.S.C. 154(b) by 91 days.

(21) Appl. No.: 10/891,877

(22) Filed: Jul. 15, 2004

(65) Prior Publication Data

US 2004/0245593 A1    Dec. 9, 2004

Related U.S. Application Data

(63) Continuation-in-part of application No. 10/355,838, filed on Jan. 31, 2003, now abandoned, and a continuation of application No. 10/795,040, filed on Mar. 5, 2004, now abandoned.

(51) Int. Cl.
*H01L 31/00* (2006.01)
*H01L 29/04* (2006.01)
*H01L 29/06* (2006.01)
*H01L 31/062* (2006.01)
*H01L 31/113* (2006.01)

(52) U.S. Cl. .................... 257/460; 257/10; 257/291; 257/433; 257/434

(58) Field of Classification Search .............. 257/10, 257/291, 433, 434
See application file for complete search history.

(56) References Cited

U.S. PATENT DOCUMENTS

| 3,631,303 | A | 12/1971 | Antypas et al. |
| 4,000,503 | A | 12/1976 | Matare |
| 4,348,690 | A | 9/1982 | Jastrzebski et al. |
| 4,686,555 | A | 8/1987 | Yusa et al. |
| 4,687,922 | A | 8/1987 | Lemonier et al. |
| 4,760,031 | A | 7/1988 | Janesick et al. |
| 5,244,817 | A | 9/1993 | Hawkins et al. |
| 5,495,141 | A | 2/1996 | Thomas |
| 5,501,893 | A | 3/1996 | Laermer et al. |
| 5,688,715 | A | 11/1997 | Sexton et al. |
| 5,852,322 | A | 12/1998 | Speckbacher |
| 6,020,646 | A | 2/2000 | Boyle et al. |
| 6,168,965 | B1 | 1/2001 | Malinovich et al. |
| 6,169,319 | B1 | 1/2001 | Malinovich et al. |

(Continued)

OTHER PUBLICATIONS

VLSI Technology (Second Edition) by S. M. Sze, McGraw-Hill series in electrical engineering.

(Continued)

*Primary Examiner*—Ngân V. Ngô
(74) *Attorney, Agent, or Firm*—Stanley Z Cole (57) ABSTRACT

Backthinning in an area selective manner is applied to imaging sensors 12 for use in electron bombarded devices. A further arrangement results in an array of collimators 51 aligned with pixels 42 or groups of pixels providing improved image contrast of such image sensor. Provision of a thin P-doped layer 52 on the illuminated rear surface provides both a diffusion barrier resulting in improved resolution and a functional shield for reference pixels. A gradient in concentration of P-doped layer 52 optimizes electron collection at the pixel array.

40 Claims, 10 Drawing Sheets

U.S. PATENT DOCUMENTS

| | | |
|---|---|---|
| 6,285,018 B1 | 9/2001 | Aebi et al. |
| 6,307,586 B1 | 10/2001 | Costello |
| 6,459,078 B1 | 10/2002 | Fowler |
| 6,483,231 B1 | 11/2002 | Iosue |
| 6,489,992 B1 | 12/2002 | Savoye |
| 2003/0016296 A1* | 1/2003 | Watanabe ................... 348/294 |

OTHER PUBLICATIONS

Copyright dated 1988, pp. 14-23 and 206-212.

* cited by examiner

BACKSIDE THINNING OF IMAGE ARRAY DEVICES

RELATED APPLICATIONS

This application is a continuation-in-part of U.S. Ser. No. 10/355,838, Jan. 31, 2003, now abandoned and is a continuation of U.S. application Ser. No. 10/795,040, filed Mar. 5, 2004, now abandoned.

FIELD OF THE INVENTION

The invention relates to backthinned and backthinning of solid state imaging sensors.

BACKGROUND OF THE INVENTION

Focal plane imaging sensors are well known for the purpose of acquiring an electronic image from a sensor array implemented on a semiconductor die. Particularly widely used such devices include the CMOS imaging array (hereafter, CMOS imager) and the charge coupled device (hereafter, CCD). It is known in prior art to remove material from the backside of substrates, particularly for CCD applications.

Focal plane imaging sensors can be backthinned for a number of reasons. Performance advantages of backthinned sensors can include improved light sensitivity as a result of improved effective fill factor. When properly passivated by a method such as that described in U.S. Pat. No. 5,688,715, backthinned CMOS sensors can demonstrate high sensitivity to both UV light and low energy (~0.5 to 20 keV) electrons. This property of backthinned CMOS sensors makes them particularly suitable for use in vacuum tubes as a video based image intensifier. U.S. Pat. No. 6,285,018 B1 details the use of a backthinned CMOS sensor in an electron-bombarded configuration.

The application of primary interest is the embodiment where the backthinned CMOS sensor is mounted directly opposing a photocathode in a proximity-focused configuration as detailed in U.S. Pat. No. 6,285,018. When the described sensor is used as a night vision imager, images are often captured at very low signal levels.

There are many possible variations that may be used in the backside thinning process as applied to CMOS sensors. However, characteristics of CMOS sensors place them in a class that is distinct from CCDs thereby necessitating new procedures and manufacturing approaches. It has been found in practice that materials forming CMOS imagers from a range of manufacturers are all highly stressed mechanically, particularly in respect to the silicon layers of the device. This may result from the numerous metal and dielectric layers that characterize the modern CMOS imager. CCDs in contrast to CMOS imagers can be manufactured using only a couple metal layers and much thinner dielectric layers and possibly suffer a lesser degree of mechanical stress. Consequently, when CMOS die are thinned without a support structure bonded to the front side, the device curls and often breaks. As a result (apparently) of this residual stress, CMOS die require bonding (of the front or back surface of the device) to a support structure before thinning is carried out. This is a procedure common to both CMOS and CCD imaging devices. It is additionally believed that the level of stress found in CCDs is generally low enough to allow a device supported only by substrate around the periphery of the die to be thinned successfully, whereas comparable CMOS devices for such imaging applications generally fail if not supported over the front or back surface during thinning. A typical surface support material is Corning Code 7740/Pyrex glass. Typical bonding agents are thermal coefficient of expansion (TCE) matched frit glass for vacuum compatible assemblies or epoxy for less demanding applications. U.S. Pat. Nos. 6,168,965 and 6,169,319 describe a backside-illuminated sensor and method of manufacturing the same. These patents however result in a sensor that has a transparent substrate bonded to the backside surface. In order to be useful in the application of interest, the back surface of the sensor must remain exposed open. A method for forming a supported imager assembly suitable with the application of interest is detailed in U.S. Pat. No. 6,020,646.

Special care must be taken in the design of the CMOS die or the manufacturing process in order to avoid performance degradation of the CMOS die when it is packaged for backside illumination. Details of precautions required to minimize fixed pattern noise (FPN) degradation for example, are listed in a patent application Ser. No. 10/355, 836, entitled Backthinned CMOS Sensor with Low Fixed Pattern Noise, filed simultaneously with the parent of this application, which is incorporated herein by reference. Degradation in the functionality of the CMOS sensor can also occur as a result of backside thinning. Most modern CMOS imagers include some sort of feedback loop to automatically set the black level on the output video. The analog voltage associated with true black is often obtained by reading out "Black Reference Pixels". Black reference pixels are typically arrayed immediately next to the active image array. A metal layer shields the reference pixels in order to block any incoming light. Circuitry within the CMOS sensor then sets the voltage output by these reference pixels to yield a low count or a user specified set point value that will typically be displayed as black. Cameras are traditionally set up to a black level set point that is slightly greater than the read noise. Camera gain is then set to achieve a suitable image. Proper black level set is especially important when working at very low signal levels, as is traditionally the case in the application of interest. If the black level is set too low, dim objects will be clipped and not displayed. If the black level is set too high, image contrast will suffer. When CMOS sensors are thinned via traditional methods, the backs of the black level reference pixels are exposed, as are the pixels in the active imaging array. Consequently, light and electrons incident upon the back of the die will induce signal in the reference pixels thereby voiding their value as black reference pixels.

In order to regain the benefit of black reference pixels on backside thinned CMOS die shielding of incident electrons (or photons) is required. One approach to such shielding, as described in U.S. Pat. No. 6,489,992, is to deposit a metal layer over the backside facing reference pixels, as typically used on the front side. However, in order to maintain a low dark current, characteristic of the dark current in the active array, either a special metalization is required (See U.S. Pat. No. 4,760,031) or a dopant profile must be specified on the backside surface before the metal is deposited (See U.S. Pat. No. 5,688,715). These processes however require a significant number of process steps to be performed on the die after the final light/electron-sensitive surface has been specified. These steps typically involve a photolithography step to define the deposition area. The added masking and handling steps can damage the sensitive surface thereby reducing device yield. Preserving the function of the black reference pixels, without added process steps is therefore desirable.

The target application for the invention is an electron bombarded CMOS imager such as described in U.S. Pat. No.

6,285,018 B1. Image intensifiers experience a modulation transfer function (MTF) degradation of sensor image associated with elastic scattering of electrons as the electrons strike the anode of the tube. In a proximity-focused tube the scattered (including backscattered) electrons will be attracted to, and re-impact the anode within a circle of radius equal to ~2X the tube gap. This effect, often referred to as "halo", is a particular problem when bright lights fall within the image intensifier field of view. There are a number of prior art approaches to minimize the impact of halo in image tubes incorporating a microchannel plate (MCP). U.S. Pat. No. 6,483,231 attempts to minimize halo in the cathode to MCP gap. U.S. Pat. No. 5,495,141 attempts to minimize halo in the MCP to screen gap. The collimator described in U.S. Pat. No. 5,495,141 may also be used in the target application. However, in a tube without a microchannel plate, the image flux electrons lost in the collimator will significantly reduce tube sensitivity. Other issues including tube complexity and the introduction of Moiré pattern associated with the interference of the hexagonally packed collimator and the square pixels of the CMOS sensor make this an inappropriate choice. Differences in the coefficient of expansion between the glass used to manufacture MCP-like structures and the silicon of CMOS die make it impossible to maintain pixel level alignments between a glass collimator and an electron bombarded active pixel imager over normal environmental temperature ranges. Modern dry etch technology is now capable of producing highly anisotropic etched structures in silicon. One method used to generate such structures is described in U.S. Pat. No. 5,501,893.

In modern image array sensors, pixel size is decreasing in line with the lower critical line width that can be held in modern fabrication facilities. The resolution of a back-thinned sensor is a function of both pixel pitch and the thickness of the residual epitaxial material. In electron-bombarded backthinned sensors, the electrical charge is typically deposited proximate the back surface of the sensor as electron-hole pairs formed by energy loss of an incident energetic electron (or light quantum). The charge then follows a more or less random walk until it is captured in the charge collection node of a pixel. The random walk of diffusion results in resolution degradation in that charge deposited directly behind one pixel has some probability of diffusing to the charge collection node of a different pixel. As a general rule, the residual thickness of the epitaxy should be less than the pixel pitch to reduce this loss of resolution. The requirements on thickness uniformity increase as the image array thickness decreases. A second complication that occurs as a result of thinner arrays is a drop in the overall conductivity of the array. In backthinned image sensors, particularly those bound for gated applications, or electron bombarded applications where significant amounts of charge need to be transferred through the image array, voltage drops across the image array associated with low conductivity can present problems. Consequently, as pixel pitch decreases the thinning process becomes more demanding. Similarly, the passivation process, which results in a sheet of doped semiconductor at the back surface of the die, requires higher doping levels to maintain the desired conductivity and surface isolation properties. Thus passivation plays a dual role. It acts as a conductive plane behind the image plane and it "passivates" the surface, both lowering the collection of surface generated dark current and increasing the sensitivity to light and low energy electrons. As the residual epitaxial surface is thinned, electric fields from underlying pixels can interact with the passivation layer. This interaction can compensate some of the doping in the passivation layer making it less effective in its dual role. The net result of the thinning of the residual epitaxial thickness is to place increased demands on the thinning and passivation process or to lower device yield.

It is known in prior art (optically) illuminated image sensors to employ a doping gradient to minimize electron diffusion which would have the effect of degrading resolution through the lateral diffusion of electrons from a trajectory from the photon interaction site toward the nearest pixel. The slight electric field consequent to the doping gradient in such instance produces an acceleration in the direction of the gradient, that is, along the normal to the pixel array, reducing those random deviations in the electron trajectory which would terminate at pixels other than that pixel nearest the photon interaction site as described in U.S. Pat. No. 4,348,690.

SUMMARY OF THE INVENTION

It is recognized that the only portion of the die that needs to be thinned in order to achieve good backside imaging performance is the backside surface region directly opposite the active pixel array. Accordingly, "area selective backside thinning" (ASBT) can be used to etch away the excess silicon from the backside of the die in the area of the active pixel array while the silicon underlying adjacent circuitry, bond pads and the periphery of the die is left thicker. The thicker layer, typically >25 microns thick, can be used to physically stabilize any unsupported portions of the membrane, thereby increasing device yield.

The selective thinning, herein described, deliberately excludes the black reference pixels from illumination by proximity focused electrons. In this way, the unthinned silicon can serve to shield the black reference pixels from both electron induced signal, which is induced primarily within the first 500 Å of silicon for a 2 keV electron, and most of the light induced signal. Due to the high level of electron bombarded gain, typically >100, this shielding is sufficient to allow the black reference pixels to serve their designated purpose for the targeted application.

It has been determined in practice that if the substrate is thinned to the 25 µm range, electrons generated at the exposed surface of the substrate can diffuse into the black reference pixels. Adding a diffusion-blocking layer or layers between the substrate and the low-doped epi can prevent this. The diffusion-blocking layer can be quite thin, 0.1 µm is more than thick enough to be functional. One potential approach is to include a heavily P-doped layer. The doping in this layer is chosen so as to introduce a >3kT barrier in the conduction band. In the ASBT process, the only required photolithography step is the one used to define the etched area. This step is performed on a planar surface before the final surface of the active area has been exposed. This approach replaces metal shield patterning photolithographic process steps, which are not well suited to non-coplanar surfaces such as those generated by ASBT.

The concept of ASBT can be further extended to generate a monolithic collimator structure on the backside of the silicon substrate that is aligned to the CMOS pixels. This collimator structure has little effect upon the accelerated photoelectrons. Secondary/backscattered electrons arising from the interaction with the anode of the (primary) proximity focused photoelectrons would ordinarily be accelerated along trajectories back to the pixel array, contributing signal to pixels other than that pixel to which the original primary electron was directed, thus contributing to halo, poor resolution, etc. The collimator structure effectively constrains these scattered electrons from trajectories ultimately terminating on nearby pixels. In addition, this monolithic structure provides a robust support for the selectively thinned regions of the substrate. Each elemental collimator of the monolithic collimator surrounds a pixel or a symmetric subarray of pixels, whereby the pixel fill factor is uniformly maximized and electron scattering induced crosstalk is minimized. Preferred configurations include single pixel elements and 2×2 pixel square subarrays.

ASBT represents an approach to improve thinning yield on backside thinned CMOS sensors. There is an alternative approach to improving thinning yield that is applicable to any area array image sensors independent of the type of image sensor architecture and regardless of whether or not ABST is employed. The approach employs a multiple stop layer structure. The simplest manifestation of this structure would consist of an I-P-I epitaxial structure on a standard P doped substrate as further elaborated below. This approach offers a number of distinct advantages over previously described etch stop techniques. First the use of a double stop layer improves thickness control. Second, terminating the etch leaving the P-doped layer relatively intact both increases the conductivity of the remaining epitaxy and isolates the passivation layer from the influences of the electric fields generated in the underlying circuitry. In practice this minimizes the appearance of dark current defects or "hot" pixels. A further refinement of this approach would be to add a doping ramp into the P-doped layer. This introduces a conductivity gradient "drift" region to introduce a small electric field to enhance conduction band electrons toward the collection node of the proximate pixel. Merely as an example, U.S. Pat. No. 3,631,303 at FIG. 4, details a III-V photocathode that uses a doping ramp to generate a drift field.

It should be noted that although designed for use in backthinned image arrays, the ramped structure will improve resolution on frontside illuminated devices particularly in the red where photons are absorbed deep within the silicon, U.S. Pat. No. 4,348,690 describes this advantage. The doping gradient employed in U.S. Pat. No. 4,348,690 varies within the range $10^{14}$ to $10^{16}$ dopant atoms/cm$^3$. This range of doping provides a sufficient built in gradient without compromising the silicon's minority carrier diffusion length. The minority carrier diffusion length of silicon falls as doping increases. At a P-doping level of $10^{16}$ silicon retains an electron diffusion length on the order of 500 microns. Consequently virtually no photo-electrons are lost within the 10 microns or so of gradient doped epitaxy. Peak doping at the $10^{16}$ level is unacceptable for electron bombarded active pixel array sensors. In such application, at a target operating voltage of (for example) 2 KeV, the peak in electron-hole pair generation occurs at a depth of just over 200 Angstroms. In order to collect these electrons the surface doping must overcome the depletion associated with surface charge. In order to overcome the surface depletion within 200 Angstroms, doping levels on the order of $10^{19}$ atoms per cubic centimeter are required. At $10^{19}$ doping levels, the diffusion length of electrons in silicon is only a few microns. Consequently, to optimize the overall collection efficiency of an electron bombarded sensor, a more complex ramp is required which is characterized by a very high dopant concentration very close to the surface of incidence. The required ramp will achieve a surface doping concentration of at least $5 \times 10^{18}$ atoms per cubic centimeter but drop to below $1 \times 10^{18}$ atoms per cubic centimeter within the first micron of the surface. The balance of the gradient may then decline to dopant concentration levels similar to prior art, yielding a composite gradient, which may be characterized, as a whole, to be non-linear.

BRIEF DESCRIPTION OF THE FIGURES

FIG. 2b is a section through the chip of FIG. 2a. FIG. 2c is a section through a globally thinned chip of FIG. 2a.

DETAILED DESCRIPTION OF THE INVENTION

Figure 1:
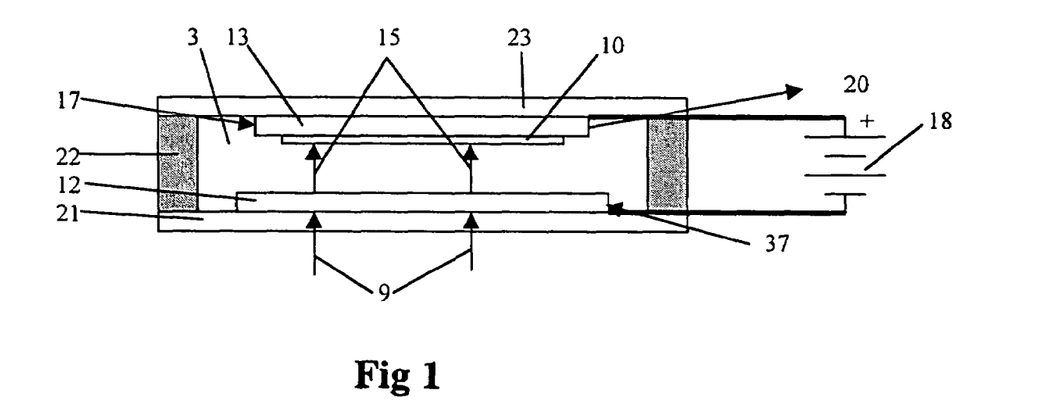
FIG. 1 describes the context of the invention.

The context of the invention is illustrated in FIG. 1 where there is shown an example of an electron bombarded active pixel array component including a vacuum enclosure 3 which houses a photocathode 12 such as a GaAs, an InP/InGaAs, a transferred electron photocathode, or a multi-alkali photocathode, in proximity focus with a specialized active pixel array sensor chip 13 which forms the anode for receiving the proximity focused photoelectrons from photocathode 12 to which an acceleration voltage 37 is applied. In accordance with this invention the active pixel array sensor 13 is mounted with its backside 10 facing the photocathode 12. Photoelectrons 15 are emitted from photocathode 12 in response to incident light illustrated as arrows designated 16. Optical components, not shown, are typically employed to form an optical image on the photocathode. Any projection system may be used to place an image on the photocathode.

The photoelectrons 15 are accelerated by an applied voltage to sufficient energy to allow electron gain in the chip in which the active pixel sensor 13 is found. The accelerating voltage 17 (or photocathode bias from a power supply not shown) applied to the photocathode 12 is preferably negative with respect to the chip. This permits biasing the chip to near, or at ground to simplify interfacing with other components. Control signals and bias voltages 18 are applied to active pixel sensor 13 and a video output signal 20 may be taken off sensor 13. The base of vacuum device 12 is a transparent faceplate 21 and vacuum enclosure sidewalls 22 extend between the transparent faceplate 21 on which the photocathode 12 is positioned and header assembly 23, on which the active pixel sensor chip 13 is positioned. The header assembly 23 also provides means for electrical feedthroughs for applying control and bias voltages 18 to the active pixel array sensor chip 13. The control electronics for reading out and operating the pixel array are conventional for the purpose and not essential to understanding the present invention. Thinning of the backside 10 of the substrate of the active pixel array sensor provides for a greater transparency to the photo-generated electrons 15 and reduces the crosstalk between pixels as a result of diffusion. Consequently, thinning is required to achieve high resolution images. The electron bombarded active pixel array sensor is usefully employed in various systems, such as cameras, night vision imagers and the like. To that end, optical lenses or the like form an image of real objects on a focal plane which is ordinarily disposed to coincide with the photocathode 12. Under conditions of a sufficiently bright image, the focal plane is formed on the backside thinned surface of the pixel array and the bias may be adjusted to preclude the photoelectron flux 15 and operate in a conventional optical image regime. This optical mode of operation is known. See U.S. Pat. No. 4,687,922. The optical devices (not shown) are known to one of ordinary skill in the art and need not be discussed for an understanding of the invention. Taken together, the electron bombarded active pixel array component with optics, power supply and control electronics may be regarded as a camera system.

Figure 2A:
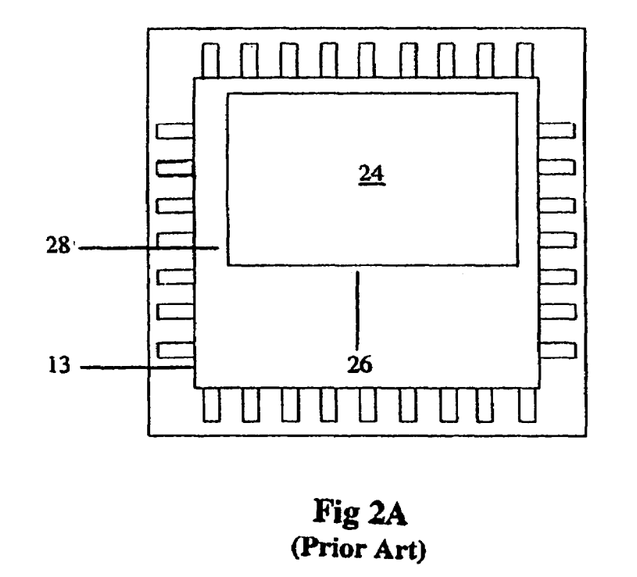
FIG. 2a shows a typical CMOS imaging die flip-chip bonded to a support substrate.
Figures 2B, 2C:
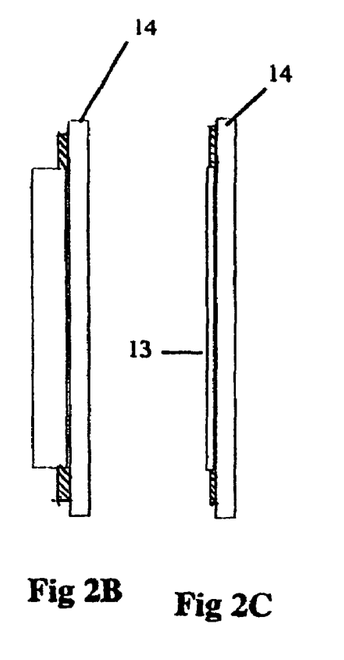

FIG. 2 is a view from the backside of a typical CMOS pixel array sensor chip 13 bonded to a (front side) supporting member 14. The pixel array occupies a region 24 and a major region of adjacent chip area holds the circuitry supporting the functions of the pixel array. A small number of rows and columns of the pixel array are reserved for reference pixel functions and the corresponding backside regions are denoted by areas 26 and 28. A side view is shown in FIG. 2b. Considerable effort was initially expended with disappointing results to achieve backside thinning of the entire chip 13 as might be envisioned to result in FIG. 2c. Backside thinning techniques typically incorporate both a bulk silicon removal technique followed by a selective wet chemical etch that stops on a chemically modified layer underlying the CMOS circuitry. A variety of silicon chemically selective stop etch techniques are documented and known to those skilled in the art. Although the root cause of the observed failure to achieve satisfactory global backside thinning is not completely clear, it has been observed that chemically selective stop etch techniques are more likely to fail on CMOS imagers than on CCDs that incorporate identical stop layer structures. It has been observed that stop layer failures are most likely to occur in the area of the die that overlies CMOS support circuitry as opposed to the active pixel array.

Figures 3A, 3B:
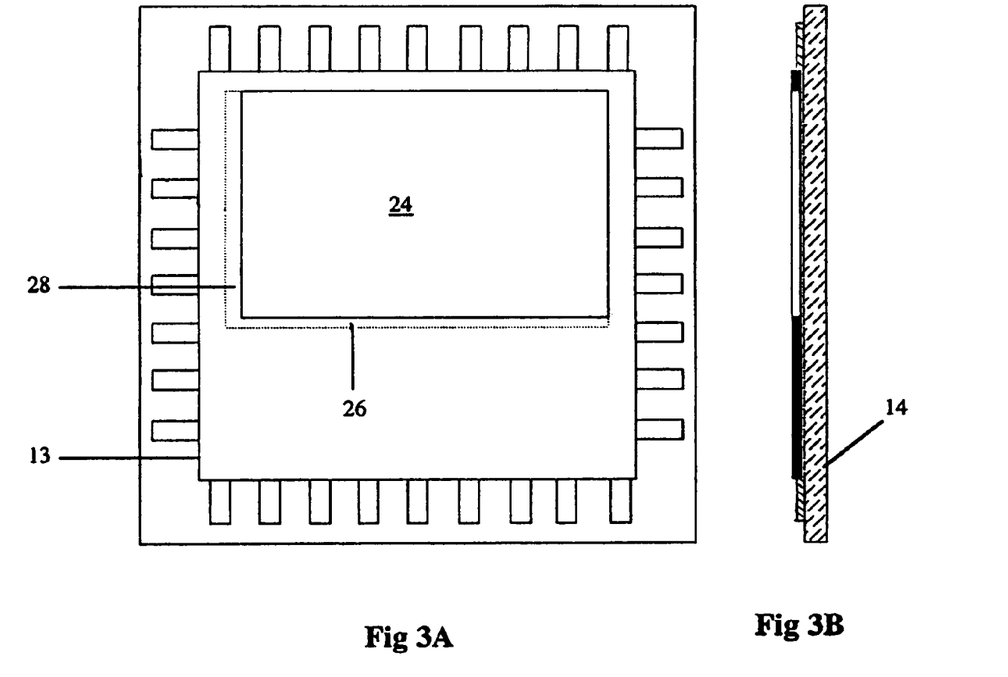
FIG. 3a is a section through the chip of FIG. 2a in accord with the invention.
FIG. 3b is based on FIG. 2c.

FIG. 3 (a and b) is a profile of the inventive arrangement applied to corresponding FIGS. 2a and 2c. It is desired in this embodiment to achieve backside thinning limited to the region 24. Likelihood of stop layer failure is observed to be minimal with this configuration.

CMOS die are typically produced on a silicon epitaxial layer doped to a low concentration. The layer is typically between 5 and 25 μm thick. The epitaxial layer is typically doped such that its resistivity is >10 Ohm-cm. Substrates are typically boron doped to achieve a resistivity <0.05 Ohm-cm. CMOS die are attached to a support substrate as described in U.S. Pat. No. 6,020,646. The CMOS die is then globally mechanically thinned using industry standard grinding and polishing equipment. The silicon is typically thinned to between 25 and 125 μm total thickness. A dry-etch mask is then photolithographically defined on the flat, polished surface to expose the silicon in those areas to be etched. A highly anisotropic dry etch is used to remove silicon from the unmasked area. For example, if the total silicon thickness is thinned to 100 μm on a CMOS die assembly manufactured on 10 μm thick epi, one might dry etch away 70 μm of substrate leaving 20 μm of substrate to be removed in the subsequent chemical etch. Typically, greater than half of the remaining substrate silicon is removed. The dry etch mask is then stripped away. A chemical etch that selectively etches the substrate but not the epi is used to etch down to the epi. This process is well described in U.S. Pat. No. 5,244,817, which describes an optically responsive pixel array with a p-type optimized for photo-response. However, during this process, the support electronics are protected from the etch by the silicon profile specified in the dry etch step. Also, trenching and other etching artifacts are avoided because the "silicon mask" etches at the same rate as the substrate thereby avoiding any etch rate variances at the edge of the mask due to etch loading. The back surface of the die is then passivated as described in U.S. Pat. No. 5,688,715

In regard to the regions 26 and 28 (black reference pixels), it may be noted that some light (passing through the photocathode) is transmitted through the silicon shield. Although typically considered a problem, this can be used as a feature in the target application. U.S. Pat. No. 6,307,586 B1 describes how an electron shielded light detector can be used within the automatic gain control (AGC) algorithm to control the duty cycle of the photocathode bias. U.S. Pat. No. 6,307,586 is incorporated by reference herein. Although somewhat attenuated, if the silicon over-layer is kept thin (<~25 μm), and a diffusion-blocking layer is grown into the epi, sufficient light can be detected to allow covered pixels to serve as electron shielded light detectors. As described in U.S. Pat. No. 6,307,586 the light induced signal can be used to determine when there is enough light to forgo electron bombarded gain altogether, or to vary the duty cycle of the photocathode bias supply. In more demanding applications, a metal layer can by applied over the silicon to completely block the optical signal to black reference pixels. Unfortunately, after the surface is profiled using ASBT, high quality photolithography becomes difficult.

Figure 4:
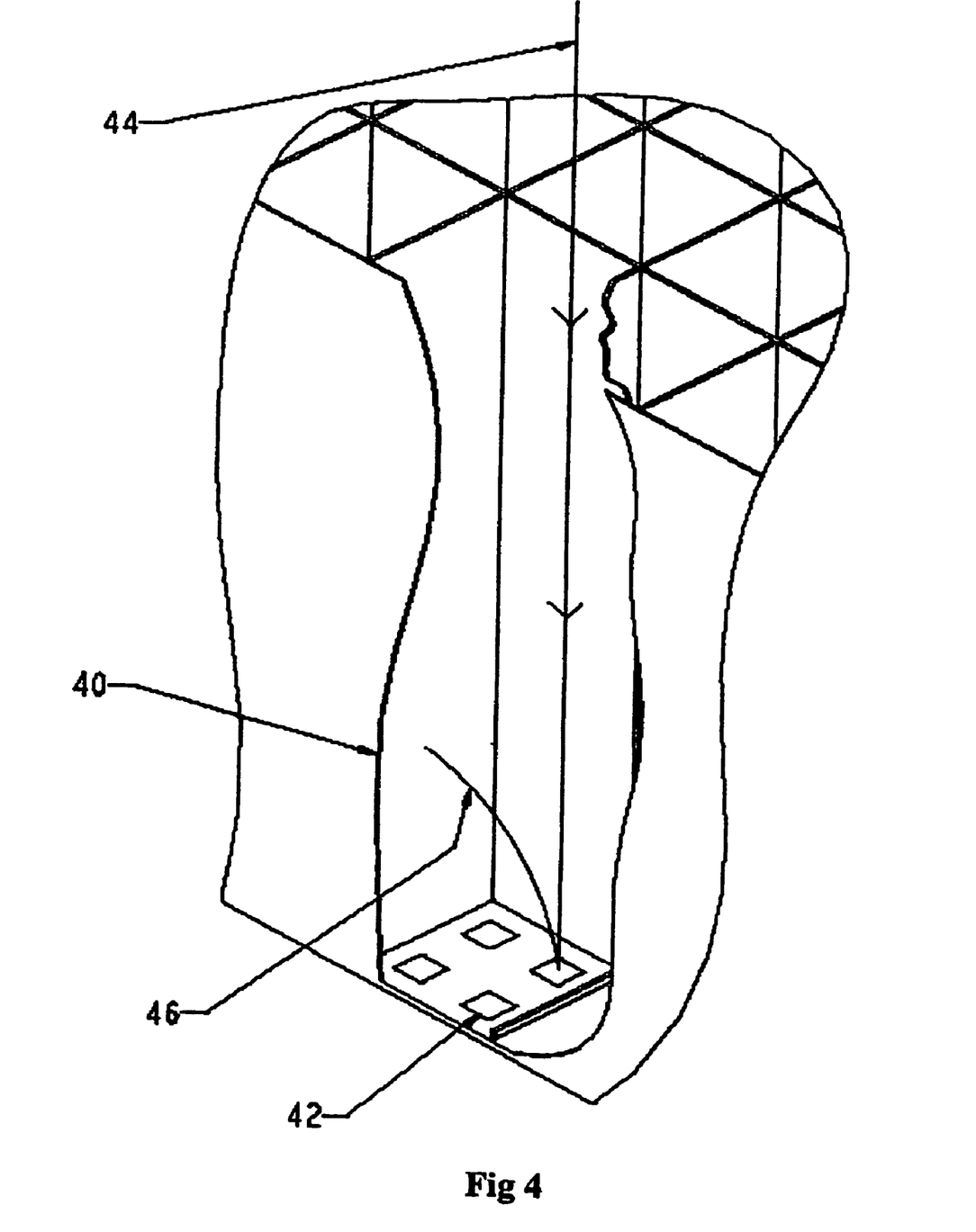
FIG. 4 is a perspective/cut-away view of another embodiment of the invention.

Turning now to FIG. 4 there is shown a cut away perspective view of a portion of the backside of the chip 13, wherein ASBT is used to produce a monolithic collimator array aligned with the pixel array of region 24, a 4-pixel sub-array of which are shown in dotted lines. Alignment, for the purpose of this work, is accomplished where the normal to the center of a pixel (or center of a group of pixels) is collinear with the long axis of the corresponding collimator. As illustrated, an elemental collimator 40 is aligned with square subarray of 4 pixels 42 which are disposed within, and proximate the front side of the die. An exemplary backscattered electron trajectory 46 is shown terminating on the interior walls of the elemental collimator 40. But for the collimator, such backscattered electrons would excite pixels other than that pixel directly on the initial trajectory of a proximity focused electron, thus degrading resolution and contributing artifact such as the halo effect. Thus, the collimator functions as a baffle in respect to scattered electrons. It is clear that backscattered electrons are a relatively small effect and the halo effect, as such, becomes significant for very bright image features. However, the suppression of backscattered electrons is always desirable for the further reason that this is a source of background noise. It is apparent that the collimator array also provides a substantial degree of mechanical robustness to the chip where the rear facing area portions enclosed within each collimator are backthinned in accord with the invention.

Figure 5:
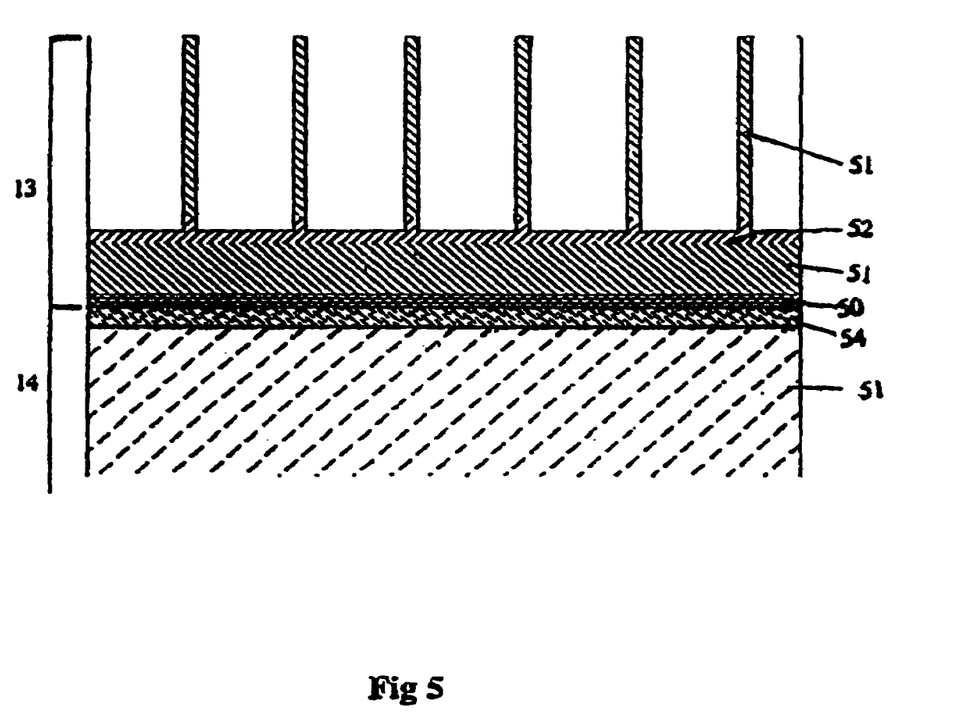
FIG. 5 is a section through the embodiment of FIG. 4.

FIG. 5 is a section through the relevant portion of a pixel array chip 13, including that embodiment incorporating a monolithic collimator 51 as above described. In order to achieve the collimator structure 51, the part is first globally thinned to the desired collimator height. This may either be accomplished via a stop layer in a thick epi growth or through careful mechanical thinning of the substrate. Ideally, the flatness of this intermediate layer will be sufficient to allow a controlled non-selective dry etch to generate the final exposed surface. The etching process is typically split into two steps. First, a highly anisotropic etch is used to define the geometry of the structure (For example, see U.S. Pat. No. 5,501,893). The device is then cleaned and followed by a chemical dry etch. The purpose of the chemical dry etch is to remove contaminants and mechanical damage induced by the anisotropic dry etch (Ref. VLSI Technology, S.M. Sze, p. 211). Although, Sze states that a wet etch is required, when contaminants are volatile a dry chemical etch with a process gas such as Xenon Difloride appears to be sufficient. The depth of this second isotropic etch is kept low so as not to destroy the previously defined geometry, 500 Å of etching should be sufficient. Ion implant followed by laser annealing passivates the exposed surface to finish device processing. Ideally, a separate well is etched for each pixel for single pixel collimation. Good collimation is achieved through the use of walls that are ~5 times as high as the subarray pitch. Much higher ratios of wall height to pixel pitch may be employed. A slight improvement in MTF is also realized as a result of the signal shadow created by the walls at the border between adjacent pixels. This improvement in MTF somewhat compensates for the loss of signal associated with the shadowing effect. If the loss of signal associated with the wall shadowing is considered too great, it can be reduced by approximately a factor of 2 by surrounding square groups of pixels (preferably, 4) with the described walls. Once again, individual pixels or patches of pixels inside the image array can be left covered in order to serve as electron shielded light detectors.

The CMOS device 50 is produced on an epitaxial layer structure 51. The first layer is typically between 5 and 35 μm thick. The epi is typically doped such that its resistivity is >10 Ohm-cm (~1×10$^{15}$ P-type). A thin P-doped layer 52 is grown as a dark current blocking layer. This layer can be on the order of 1 micron thick doped to approximately 10$^{17}$ B/cm$^3$ (~0.4 Ohm-cm Boron doping). The final layer on which the CMOS structure 53 is fabricated is typically approximately 5 microns thick, again doped to achieve a resistivity of >10 Ohm-cm. Substrates 51 are typically boron-doped to achieve a resistivity <0.05 Ohm-cm. CMOS die are attached to a support substrate 56 as described in U.S. Pat. No. 6,020,646. As discussed above, a common choice of substrate is Corning Code 7740/Pyrex glass bonded to CMOS structure 53 through a suitable matched TCE agent 54. The CMOS die is then globally mechanically thinned using industry standard grinding and polishing equipment. The silicon is typically thinned to less than 125 μm total thickness using a chemical etch that selectively etches the substrate globally to the surface of the epi. This process is well described in U.S. Pat. No. 5,244,817. Photolithography is used to define a dry etch mask on the flat surface of the exposed epi. A highly anisotropic dry etch is used to etch from the exposed surface into the P-doped dark current blocking layer. The back surface of the die is then passivated as described in U.S. Pat. No. 5,688,715. The function of the P-doped layer is to form a potential barrier to diffusion in the conduction band to limit electrons generated in the substrate 51 by incident high energy electrons 15. To be effective for the purpose, the barrier should be at least 3kT in height and of a thickness sufficient to prevent tunneling. The layer should also contain enough dopant to prevent full depletion from ever occurring. Excessive thickness is to be avoided, e.g., in order to minimize charge carrier loss through recombination. It is apparent that the utility of the P-doped layer 52 is independent of the architecture of the pixel array, and is applicable to CCD or other photodiode arrays.

Figure 6:
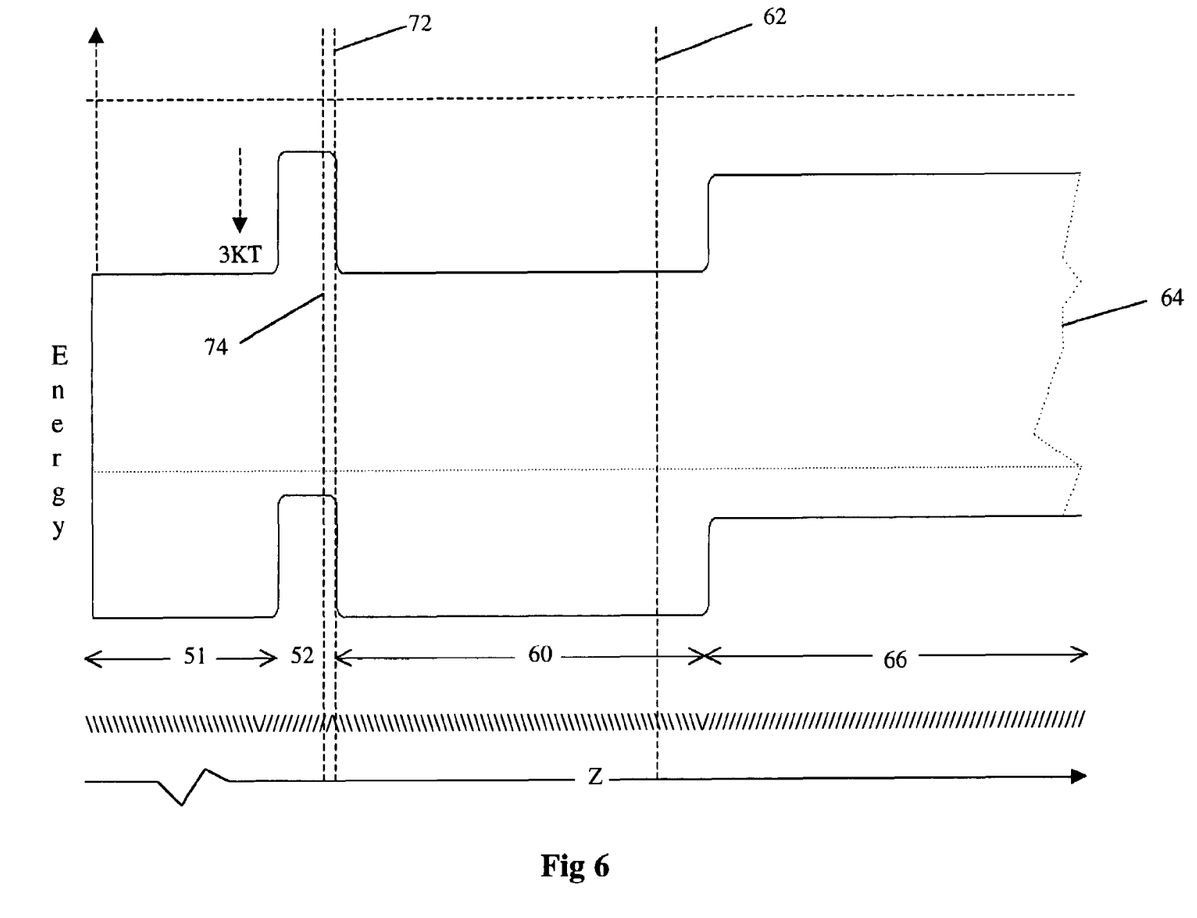
FIG. 6 is a band diagram showing the double stop layer epitaxial structure.

FIG. 6 is one example of a multiple stopping layer band structure of the present invention. The example is a two stop layer structure for achieving improved uniformity. If for example the etched surface 64 of a p type substrate 66 originally shows a 10 micron non-uniformity, a single stop layer with 10X selectivity will only reduce non-uniformity to the 1 micron range. Two stop layers both with 10X selectivity will reduce surface non-uniformity to a mere 0.1 micron. This is an important difference on close pitch die where the final epitaxial thickness may be on the order of 5 microns.

Figure 7:
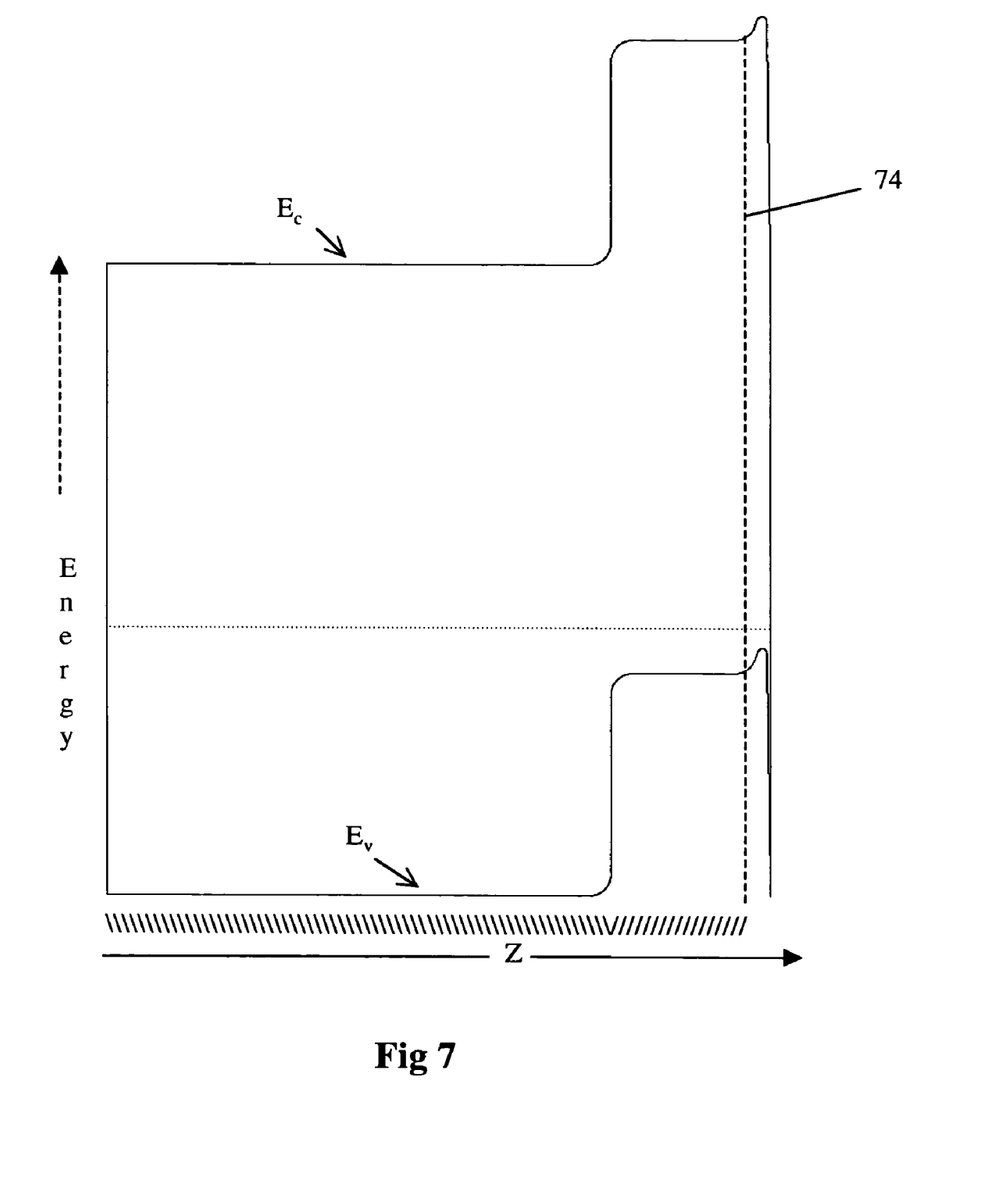
FIG. 7 shows the band diagram of FIG. 6 after thinning and passivation

The example of FIG. 6 is shown as implemented in an intrinsic-P-intrinsic structure prior to etch. (An "intrinsic" layer simply indicates a low doping level typically resulting in a resistivity of >10 Ohm-cm.) The structure may for example have the following profile starting from the device epitaxy (CMOS, CCD, or the like), e.g., substrate 51, comprising (typically) a 10 micron layer of 10 Ohm-cm Si upon which there is formed about 0.5 micron of 0.003 Ohm-cm Boron doped Si comprising the eventual P-doped layer 52, followed by 4 microns of 10 Ohm-cm Si forming stop layer 62. The intrinsic (I) layer 60 lying next to the substrate 66 functions as the initial stop layer 60. The substrate 66 is removed using a selective etch to a first stop depth 70 as described in U.S. Pat. No. 5,244,817. At this point the die is re-etched in an aqueous alkaline chemical bath that selective etches low-doped silicon but does not etch P-doped silicon and therefore the etch stops at the second stop depth 72. A typical choice for this step would be an ethylenediamene pyrocatecol (EDP) etch. A short non-selective etch may follow to insure full removal of the low doped material indicated as an etched surface 74. The now newly exposed P-doped layer 52 is subsequently passivated to produce surface passivation 76 as previously described. FIG. 7 is the resulting conduction band potential distribution following the double stop processing and passivation described above.

The multiple stop layer approach described above takes advantage of the ability of wet-etch chemistries to selectively stop on silicon layers based on the subtle shift in materials properties associated with doping. With optimized baths, although the dopants can represent a small fraction of 1% of the atoms, selectivities of >100X can be achieved. A variety of etch techniques are available for realizing the desired P-doped layer with requisite parameters of thickness and dopant concentration. With the level of control that is currently achieved in modern dry etch reactors, a completely dry backside thinning process is also possible. Similarly, hybrid processes that combine both wet and dry etching can be used. Bulk removal can be accomplished either through a wet chemistry bath or via a high plasma density ion assisted dry etch. The final I-layer should be removed via a slow etch that employs a sensitive end point detection technique such as optical monitoring of the Boron spectrum of the plasma. A final dry etch should be performed to remove surface damage induced by ions present in the plasma. The final etch may be strictly a chemical dry etch such as Xenon Difloride, 500 Å of silicon removal is sufficient.

Figure 8:
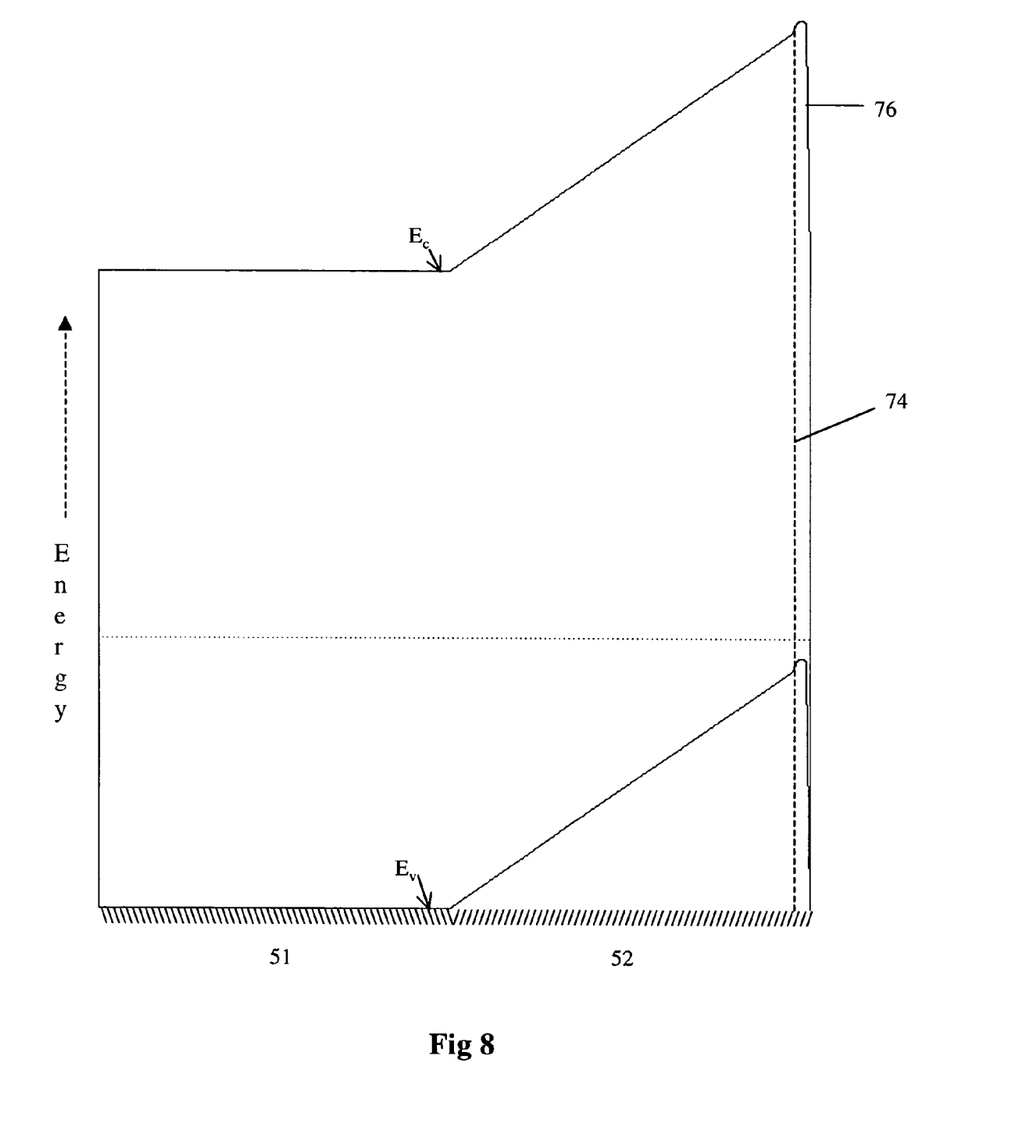
FIG. 8 shows a modified variant of the band diagram of FIG. 7.

Turning now to FIG. 8 there is shown an embodiment wherein a P-doped layer 52 (as described above) is established with a doping concentration smoothly varying to produce a region of potential gradient. The doping gradient parameters are selected in accord with additional requirements to minimize hot pixel/dark current effects. This is typically accomplished by varying the concentration of the dopant containing gas in the epitaxial growth reactor as the layer is being deposited. The exact concentrations and species used are dependent on factors such as reactor configuration and process conditions. Those skilled in the art can calculate and specify a process that will result in an approximately linear electric field ramp within the doped layer. After chemical processing, this layer is exposed as the back surface of the backthinned die. Such a drift layer accelerates electrons created at a given site within the semiconductor device toward the proximate collection node in the pixel array thereby improving resolution.

As disclosed above the, monolithic collimator array provides substantial suppression of "halo" to the advantage of the resulting image. The embodiment described features formation of the collimator array directly on the die as an integral structure. For such an embodiment, the array of elemental collimator elements is in registry with the pixel array to the precision characteristic of photolithographic techniques. In another embodiment it has been observed that the collimator array (array of elemental collimators) may be formed independently from the rest of the imager device and subsequently bonded to the imager die with some disregard for direct registration of pixels to collimators since this will generally not be deleterious to the image obtained if compared to prior art (uncollimated) imaging devices. This surprising result represents a balance between loss of sensitive pixel area from a tolerable degree of alignment error (of the collimator array to pixel array) and the increase in image quality resulting from halo suppression. The step of joining the separately constructed collimator array to the die supported pixel array may result in overlay of some pixel area by the finite walls of the elemental collimators. A "tolerable unalignment" for this purpose is an alignment of a type required to introduce no bias to the different sensitive areas within the corresponding open areas of the elemental collimators for the set of elemental collimators on account of assembly in an unaligned manner. Another expression of this requirement is that overlay of pixel surface by finite walls of an elemental collimator is such that each such overlaid pixel must exhibit a constant value of sensitive area within each elemental collimator. The periodic collimator array introduces no modulation of the image if the cross section of an elemental collimator contains substantially a single pixel (or a single subarray of pixels binned together). The extent of this concept of tolerable unalignment is better expressed in reference to the geometry of pixel shape or pixel sub-arrays. Rectangular pixel arrays (or sub-arrays binned together for response as a single pixel) are preferred, although the invention is by no means so limited. The axes of the rectangular pixel array defines the permitted degrees of freedom for relative displacement of the collimator array relative to the pixel array. The collimator array exhibits the same array geometry as does the pixel array, although the pitch of the collimator array may be selected as some integer times the pitch of the pixel array if the pixel sub-array is binned together. That is, the shape of cross section of the elemental collimator is geometrically similar to the shape of the photosensitive surface of the pixel. A tolerable unalignment of the pixel array with the collimator array comprehends displacements of the collimator array along the pixel array axes. Rotational displacement, e.g., non conforming angular alignment, is not a tolerable unalignment, because different overlaid pixels will exhibit different unencumbered sensitive areas.

The formation of the collimator array on a separate collimator die is carried out in conventional photolithographic and etching procedures, as above described. The thickness of the collimator, or height of the collimator normal to the plane containing the pixel array, is carefully controlled through conventional combinations of mechanical and chemical means. The height is typically selected in respect to the lateral dimensions of the elemental collimator to limit the solid angle available to backscattered electrons. Backscattered electrons that do escape in the backward direction or scatter from the top surface of the collimator wall, with subsequent attraction again toward the imager anode, will be baffled in collision with the wall of any collimator element re-entered. The degree of halo suppression can be shown to depend upon the ratio of collimator height to collimator pitch. Practical considerations of component handling through further assembly steps are important: for example a height of 50 microns is deemed to be a manageable die thickness for mechanical handling in contemporary processes.

Common photolithographic techniques easily produce pixel arrays exhibiting a selected orientation of the array with respect to eventual die boundaries. In like manner, the collimator array is fabricated in selected orientation to the eventual boundaries of that component. The limits of tolerable unalignment, as defined above, are met by the mechanical or optical alignment of the two components, which are bonded in steps well known in the art. While no steps are taken to cause direct registration of the two arrays, each array is separately referenced to the boundary of the respective substrate and the tooling employed in handling the two components during the joining of the two components is sufficient to establish the desired orientation. Accordingly, the mutual angular orientation of the pixel array with the collimator array is thereby controlled although displacement error of the two arrays may occur. Such error may, or may not occur to any substantial extent, and therefore a tolerable unalignment may in fact comprise no substantial misalignment at all. The periodicity of the arrays limits the effect of such error and the present invention is directed to achieving a resulting image superior or equal to prior art devices, with a manufacturing advantage for a composite device.

Figure 9A:
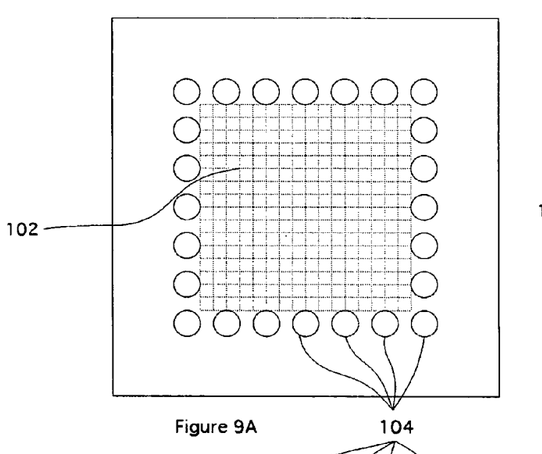
FIG. 9a–9d inclusive, is a schematic illustration of components for assembly of a composite embodiment.
Figure 9B:
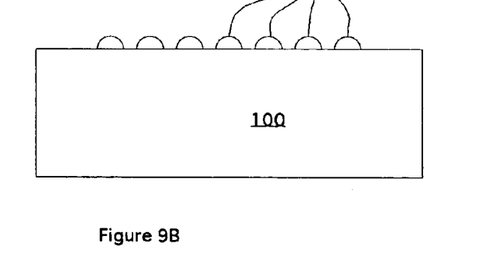
Figure 9C:
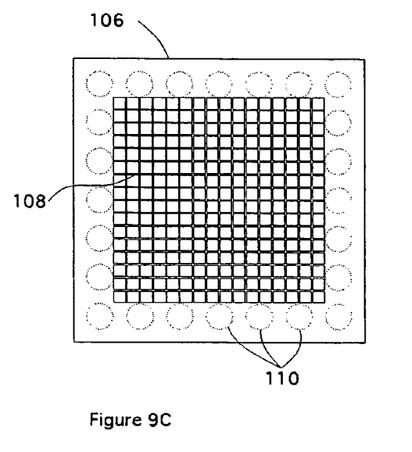
Figure 9D:
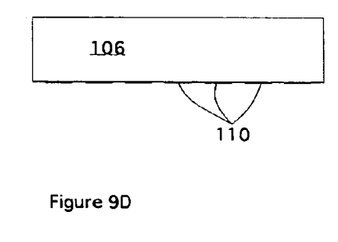
Figure 9E:
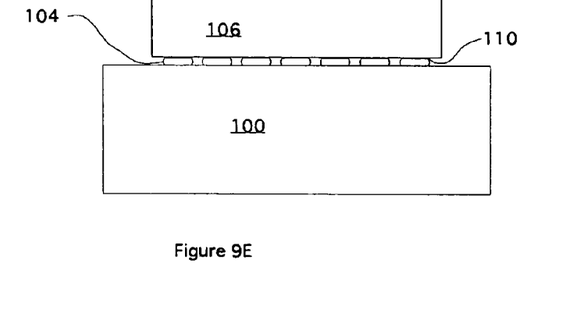
FIG. 9e shows the embodiment of FIGS. 9a–9d as assembled.

Device fabrication from composite components is commonly practiced and the particular process for achieving the joinder of planar surfaces of separately fabricated components is well known. One example of such processing is known in the art as "solder bump bonding" and a representative description is to be found at Proc. SPIE, v.2745, p. 149–158 (06/1966). A wide variety of so-called "self alignment" processes are known and practiced for this purpose. For the present invention, a selected joinder procedure in assembly includes disposing a bonding medium between the collimator substrate and the pixel array substrate in a region of the adjacent surfaces peripheral to the pixel array region. FIGS. 9a,b show a schematic representation of a die 100 supporting a square array of pixels 102 surrounded by solder bumps 104. FIGS. 9c,d show another die 106 supporting the square collimator array 108 and in turn surrounded by cavities or prepared surfaces such as solder pads 110 for receiving the solder bumps 104 and adhering thereto. The composite device of FIG. 9e results at the completion of the bonding operation. For the particular arrangement shown here, the gap between the adjacent surfaces of the pixel array and collimator array introduces no deleterious effects because these surfaces are at the same potential and electrons scattering from the interior walls of the collimator or otherwise transmitted do not experience an accelerating field. Such gap would not appear for the case of cavities replacing the pads 110. It is emphasized that a bonding medium will be interposed in the structure.

For the purposes of the present work, the thickness, t, of the collimator wall, can be regarded as small compared to other relevant dimensions. This is a practical matter inasmuch as the separation of pixels is small compared to the pixel pitch and photosensitive surface is to be maximized for considerations of economy. It is sufficient to assume that the separation of pixels and the collimator wall thickness are similar.

Figure 10:
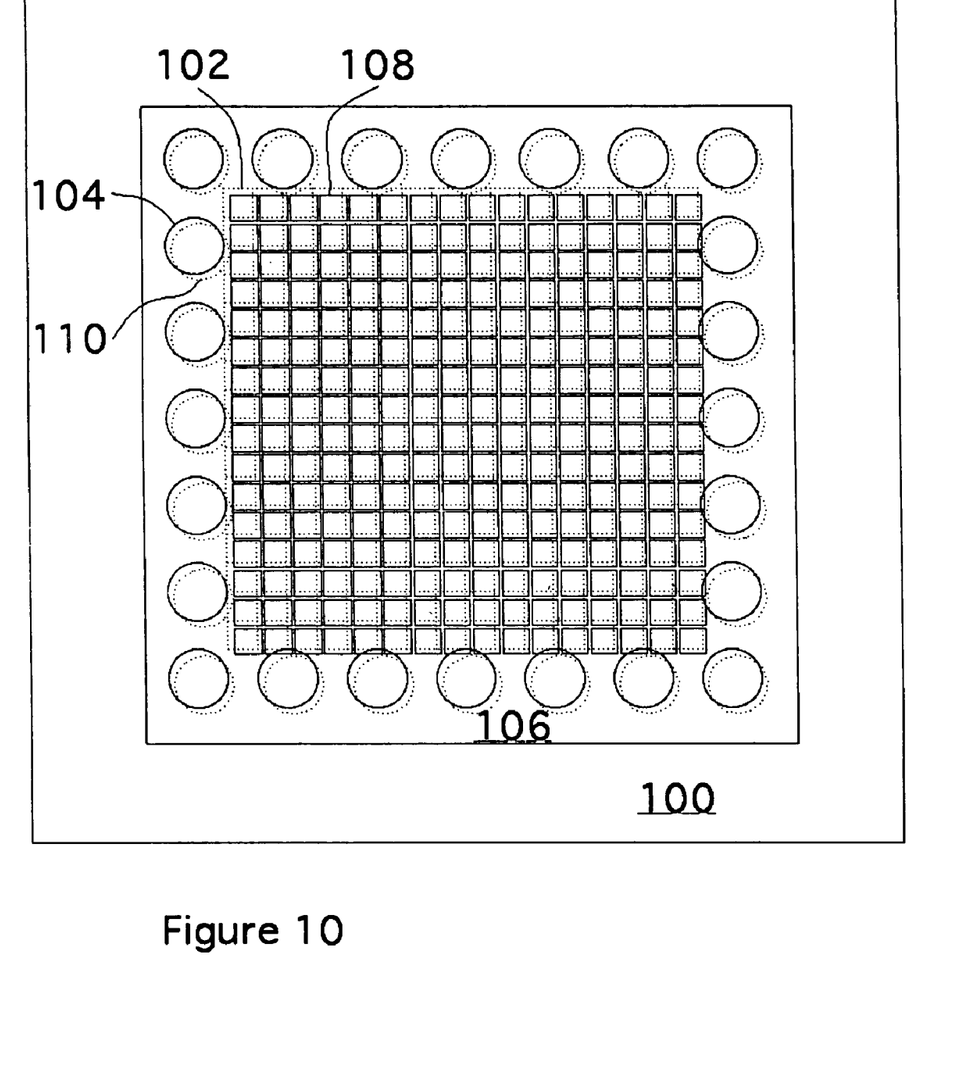
FIG. 10 illustrates a superposition of pixel and collimator components in slight offset.

FIG. 10 shows the collimator array 108 superimposed in slight offset with pixel array 102. This schematic illustration is simplified to a one-to-one collimator to pixel arrangement although it should be appreciated that this is not a limitation of the invention.

Although great flexibility of design is within the present invention, a representative preferred design is based upon an array of nominally 10 micron square pixels with center to center displacement of approximately 10 microns as discussed elsewhere in this work and a 50 micron (height) collimator array characterized by the same pitch as the pixel array. Assembly of the pixel array with a collimator array having an achievable wall thickness of each elemental collimator of 1 micron, is relaxed by tolerable unalignment as above explained.

Although this invention has been described with reference to particular embodiments and examples, other modifications and variations will occur to those skilled in the art in view of the above teachings. For example, the monolithic collimator structure is not limited to application for CMOS imagers, but is effective for any electron bombarded pixel array image sensor. Similarly, dopant types for this layer could be reversed, for sensors that collect holes as opposed to electrons in their charge sensing node, using appropriate chemical processes. This complicates the use of the double stop layer technique.

What is claimed is:

1. A CMOS imaging device supported on a die, said die having a reverse side and a front side, said CMOS imaging device comprising a pixel array disposed on a first areal portion of said die, circuits for readout of said pixel array disposed on another areal portion of said die, a region of said reverse side of said die thinned to a thickness in the range 2 to 20 µm, said region of said reverse side limited to the area of projection of said pixel array on the corresponding portion of said front side.

2. The CMOS imaging device of claim 1, said reverse side comprising a P-doped layer that introduces a diffusion barrier in the conduction band of at least 3kT to electrons generated in the substrate.

3. The CMOS imaging device of claim 1 further comprising a support member bonded to said front side.

4. The CMOS imaging device of claim 2 further comprising a reference pixel subarray shielded by said P-doped layer from said electrons while remaining responsive to optical excitation entering through said P-doped layer.

5. A solid state imaging device comprising a die, said die having a reverse side and a front side, said solid state imaging device comprising a pixel array substantially disposed on said front side within a first areal portion of said die, circuits for readout of said pixel array disposed on another areal portion of said die, a region of said reverse side being directly opposite said pixel array, an array of collimating structures overlying said region, said collimating structures aligned with said pixel array.

6. The solid state imaging device of claim 5 wherein said region of said reverse side comprises a surface and said surface comprises a P-doped layer interposed between the collimator structure and the underlying pixel array.

7. The solid state imaging device of claim 5 wherein each said collimating structure has an axis and said axis is aligned with one said corresponding pixel of said pixel array.

8. The solid state imaging device of claim 5 wherein each said collimating structure has an axis and said axis is aligned with a symmetric subgroup of pixels of said pixel array.

9. The solid state imaging device of claim 8 wherein said symmetric subgroup comprises $N^2$ pixels and said axis intercepts the centroid of said subgroup.

10. The solid state imaging device of claim 5 wherein said die is of thickness H and said die is reduced in thickness to H-h and each said collimating structure is a hollow axial form having an interior length of h, whereby said collimating structures are monolithically formed on said reverse side of said die.

11. The solid state imaging device of claim 10 wherein said subgroups of pixels are spaced with a pitch P and h/P is in a range between 1 and 20.

12. The solid state imaging device of claim 11 wherein said solid state imaging device is a CMOS image sensing array.

13. The solid state imaging device of claim 11 wherein said solid state imaging device is a CCD image sensing array.

14. A solid state imaging device comprising a die, said die having a front side and a reverse side, a pixel array disposed on said front side at a first areal section of said die, said reverse side of said die corresponding to said first areal section thinned to a thickness of approximately 2 to 20 µm, circuits for readout of said pixel array disposed on a second areal section of said die, an array of collimators disposed on said thinned first areal section to transmit an electron flux directed toward said areal portion of said die through said collimators to said die.

15. A digital imaging camera comprising
optical components for forming an image on a focal surface,
a photocathode disposed on said focal surface,
a solid state imaging device supported on a die, said die having a reverse side and a front side, said solid state imaging device comprising a pixel array disposed on a first areal portion of said die, circuits for readout of said pixel array disposed on another areal portion of said die, the region of said reverse side directly opposite said pixel array disposed facing said photocathode,
a vacuum enclosure for maintaining an evacuated space between said photocathode and said solid state imaging device,
an electric potential imposed between said photocathode and said imaging device to maintain the distribution of said photoelectrons in accord with the optical distribution on said photocathode and to cause said photoelectrons penetrating said reverse side to interact with said active pixel array,
said reverse side comprising a selectively thinned region in a predetermined pattern encompassing less than the entire surface of said reverse side of said die, wherein said predetermined pattern comprises portions adjacent said at least one selectively thinned region and overlaying a projection of selected pixels of said pixel array, whereby said selected pixels comprise reference pixels for obtaining a reference pixel signal.

16. The digital imaging camera of claim 15 wherein said solid state imaging device is a CMOS imager.

17. The digital imaging subsystem of claim 15 wherein said solid state imaging device is a CCD imager.

18. The digital imaging subsystem of claim 15 wherein said reverse side comprises an array of collimating structures formed on said region, said collimating structures aligned with said pixel array.

19. An imaging device sensitive to energetic electrons incident on the backside thereof, said device comprising a semiconductor die, said die having a reverse side and a front side, said imaging device comprising a pixel array substantially disposed on said front side and disposed on a first areal portion of said die, circuits for readout of said pixel array disposed on another areal portion of said die, a region of said reverse side of said die thinned to a thickness in the range 2 to 20 µm, said region of said reverse side limited to the projection of said pixel array on said reverse side, said reverse side comprising a P-doped layer that introduces a potential barrier in the conduction band of at least 3kT to electrons generated in the substrate, said P-doped layer comprising a concentration of at least $10^{18}$ dopant atoms/$cm^3$ at said backside.

20. The imaging device of claim 19 wherein said substrate comprises a thickness to said incident energetic electrons of at least twice the range of the most said energetic of said incident electrons.

21. The imaging device of claim 19 wherein said P-doped layer comprises another dopant concentration region remote from said backside, said another dopant concentration region being in the range $10^{14}$ to $10^{16}$ dopant atoms/$cm^3$.

22. The imaging device of claim 19 wherein said P-doped layer comprises another dopant concentration region remote from said backside, said another dopant concentration region being in the range $10^{14}$ to $10^{16}$ dopant atoms/$cm^3$.

23. A backside illuminated pixel array sensor for intercepting an electron flux at said back surface, said electron flux having a spatial distribution comprising an image, said sensor comprising a P-doped layer of enhanced conductivity disposed intermediate pixels comprising said pixel array and the illuminated surface of said sensor, said P-doped layer having a maximum doping concentration in excess of $10^{18}$ atoms per cubic centimeter at said back surface and further comprising a smoothly varying concentration of a selected doping agent over the thickness of said P-doped layer, whereby a corresponding conduction band gradient is achieved.

24. A solid state imaging device comprising first and second dice, said first die having a reverse side and a front side, said first die comprising a pixel array substantially disposed on said front side within a first areal portion of said first die, said pixels having a selected spacing p, circuits for readout of said pixel array disposed on another areal portion of said first die, a region of said reverse side being directly opposite said pixel array, and, a said second die comprising an array of collimating structures, each said collimator having a collimation axis having an extension h and a cross-section sufficient to receive a pixel of said pixel array, said cross-section and said pixel characterised by similar geometrical shapes, a bonding medium disposed intermediate said the reverse side of said first die on selected portions thereof to adhere said first and second dice said collimating structures oriented in respect to said pixel array with no more than tolerable misalignment.

25. The solid state imaging device of claim 24 wherein said pixel array has a selected geometrical distribution of the elements thereof and said array of collimating structures comprises a substantially similar geometrical distribution.

26. The solid state imaging device of claim 25 wherein adjacent boundaries of the elements of said pixel array are spaced apart by an interval t>p and said collimating structures of said array of collimators comprise lateral walls, and said walls comprising a thickness of substantially less than t.

27. The solid state imaging device of claim 26 wherein each elemental collimator of said array of collimators comprises an interior area transverse to said collimation axis wherein said interior area substantially accommodates a sub-array of pixels wherein said sub-array of pixels is binned together to form a common sensitive surface.

28. The solid state imaging device of claim 27 wherein said sub-array comprises a single pixel.

29. The solid state imaging device of claim 28 wherein each said pixel comprises a sensitive area that is square.

30. The solid state imaging device of claim 24 wherein the ratio h/p is in the range from 1 to 75.

31. The said state imaging device of claim 14 wherein said solid state imaging device is a CMOS image sensing array.

32. The solid state imaging device of claim 14 wherein said solid state imaging device is a CCD image sensing array.

33. The solid state imaging device of claim 14 wherein said reverse side comprising a selectively thinned region encompasses less than the entire surface of said reverse side of said die, and includes portions adjacent said selectively thinned region and overlaying a projection of selected pixels of said pixel array, whereby said selected pixels comprise reference pixels for obtaining a reference pixel signal.

34. The solid state imaging device of claim 14 wherein said die and said collimators comprise the same material.

35. The solid state imaging device of claim 34 wherein said material comprises silicon.

36. The solid state imaging device of claim 14 wherein each pixel of said pixel array comprises a selected shape and each said collimator of said collimator array comprises a cross section transverse to said directed electron flux, said cross section comprising a shape geometrically similar to said selected shape.

37. The solid state imaging device of claim 36 wherein said cross section is sufficient to surround at least one said pixel.

38. The solid state imaging device of claim 37 wherein said selected shape is an aggregate shape of a sub-array of said pixels.

39. The solid state imaging device of claim 38 wherein said selected shape is square.

40. The solid state imaging device of claim 39 wherein said sub-array comprises a single pixel.

* * * * *